(12) United States Patent
Lin

(10) Patent No.: US 10,978,747 B2
(45) Date of Patent: Apr. 13, 2021

(54) LEAKAGE DETECTION DEVICE AND BATTERY PACK HAVING THE SAME

(71) Applicant: MOBILETRON ELECTRONICS CO., LTD., Taichung (TW)

(72) Inventor: Meng-Chang Lin, Taichung (TW)

(73) Assignee: MOBILETRON ELECTRONICS CO., LTD., Taichung (TW)

( * ) Notice: Subject to any disclaimer, the term of this patent is extended or adjusted under 35 U.S.C. 154(b) by 79 days.

(21) Appl. No.: 16/397,969

(22) Filed: Apr. 29, 2019

(65) Prior Publication Data

US 2019/0363405 A1    Nov. 28, 2019

(30) Foreign Application Priority Data

May 23, 2018  (TW) ................................. 107117512

(51) Int. Cl.
*H01M 10/48*    (2006.01)
*H01M 10/42*    (2006.01)
*G01R 31/50*    (2020.01)

(52) U.S. Cl.
CPC ........ *H01M 10/4228* (2013.01); *G01R 31/50* (2020.01)

(58) Field of Classification Search
CPC ............. H01M 10/4228; H01M 10/42; H01M 10/4207; H01M 10/4285; H01M 10/4271;
(Continued)

(56) References Cited

U.S. PATENT DOCUMENTS

| 6,611,150 B1* | 8/2003 | Stevens .................. G01R 31/50 324/613 |
| 2014/0084828 A1* | 3/2014 | Yamamoto ............ B60L 3/0069 318/400.22 |

(Continued)

FOREIGN PATENT DOCUMENTS

| CN | 206178109 U | 5/2017 |
| CN | 206892800 U | 1/2018 |

(Continued)

OTHER PUBLICATIONS

Examination report for TW107117512, dated Aug. 13, 2018, Total of 5 pages (Continued)

*Primary Examiner* — Raymond Alejandro
(74) *Attorney, Agent, or Firm* — Tracy Heims; Apex Juris, Pllc.

(57) ABSTRACT

A leakage detection device includes at least one optical coupler, a voltage divider, an analog-to-digital converter and a processing unit. Wherein, the at least one optical coupler is adapted to output an electrical signal according to a leakage degree of a DC power supply. The electrical signal is divided by the voltage divider to be output to the analog-to-digital converter and converted into a digital signal. The processing is adapted to compare a digital value corresponding to the digital signal with a reference value and output a leak signal when a difference between the digital value and the reference value is greater than a predetermined difference. A battery pack includes a battery cell assembly, a switch element, and a control unit, wherein the control unit controls the switch element to switch off an electrical connection between the battery cell assembly and the load to block electric power to the load.

10 Claims, 5 Drawing Sheets

(58) Field of Classification Search
CPC ..... H01M 10/445; G01R 31/50; G01R 31/52; G01R 31/54; G01R 31/56
See application file for complete search history.

(56) References Cited

U.S. PATENT DOCUMENTS

2015/0175027 A1\* 6/2015 Garcia-Flores .... G01R 31/3648
324/426
2017/0269621 A1 9/2017 Frucht
2018/0143235 A1\* 5/2018 Kim ...................... G01R 31/42

FOREIGN PATENT DOCUMENTS

JP         H09318680 A     12/1997
TW        200627751 A      8/2006

OTHER PUBLICATIONS

Search report for TW107117512, dated Aug. 13, 2018, Total of 1 page.
English abstract for CN206178109, Total of 1 page.
English abstract for CN206892800, Total of 1 page.
English abstract for JPH09318680, Total of 1 page.
English abstract for CN200627751, Total of 1 page.

\* cited by examiner

LEAKAGE DETECTION DEVICE AND BATTERY PACK HAVING THE SAME

BACKGROUND OF THE INVENTION

Technical Field

The present invention relates generally to leakage detection, and more particularly to a leakage detection device that can immediately determine a leakage when electricity is leaked and a battery pack.

Description of Related Art

The discovery of electricity has changed the way we live our lives. Many life necessities have many breakthrough developments because of electricity, thereby improving people's living standard and convenience. In general, electric power is transmitted through electric wires to be utilized in electronic devices.

However, electric power also has many drawbacks. For example, electric power may cause a severe injury to people when they touch electricity accidentally. Among them, most of the cases on the electric shock is caused by leakage. For example, when electric power is transmitted via an old or damaged electric wire, or a potential voltage is generated between a ground and an electric device's housing after connecting to an electric wire for some reason, leakage from the housing is easily generated.

Therefore, it is necessary to provide a method for detecting whether a leakage is generated in an electric wire such that the damages caused by leakage could be avoided.

BRIEF SUMMARY OF THE INVENTION

In view of the above, an object of the present invention is to provide a leakage detection device and a battery pack which could detect leakage.

Another object of the present invention is to provide a battery pack which could block power output when leakage is generated.

The present invention provides a leakage detection device adapted to be electrically connected to a DC power supply. The leakage detection device includes at least one optical coupler, a voltage divider, an analog-to-digital converter and a processing unit. Wherein, the at least one optical coupler is electrically connected to at least one of a positive terminal and a negative terminal of the DC power supply; the at least one optical coupler is adapted to output an electrical signal according to a leakage degree of an electric wire connected between the positive terminal or the negative terminal and a load. The voltage divider is electrically connected to the at least one optical coupler, wherein the voltage divider is adapted to divide the electrical signal after receiving the electrical signal and then output a divided electrical signal. The analog-to-digital converter is electrically connected to the voltage divider, wherein the analog-to-digital converter is adapted to convert the divided electrical signal into a digital signal and output the digital signal. The processing unit is electrically connected to the analog-to-digital converter, wherein the processing unit is adapted to receive the digital signal and compare a digital value corresponding to the digital signal with a reference value, and output a leak signal when a difference between the digital value and the reference value is greater than a predetermined difference.

The present invention also provides a battery pack which includes a battery cell assembly, at least one optical coupler, a voltage divider, an analog-to-digital converter, a processing unit, a switch element and a control unit. Wherein, the battery cell assembly includes a positive electrode and a negative electrode, wherein the positive electrode is electrically connected to a positive terminal, and the negative electrode is electrically connected to a negative terminal; the positive terminal and the negative terminal are adapted to be electrically connected to a load. The at least one optical coupler is electrically connected at least one of the positive terminal and the negative terminal and adapted to detect a leakage degree of an electric wire between the positive terminal or the negative terminal and the load and output an electrical signal corresponding to the leakage degree. The voltage divider is electrically connected to the at least one optical coupler and adapted to receive and divide the electrical signal and output a divided electrical signal. The analog-to-digital converter is electrically connected to the voltage divider and adapted to convert the divided electrical signal into a digital signal and output the digital signal. The processing unit is electrically connected to the analog-to-digital converter, and adapted to receive the digital signal and compare a digital value corresponding to the digital signal with a reference value, and then output a leak signal when a difference between the digital value and the reference value is greater than a predetermined difference. The switch element is electrically connected between the positive electrode of the battery cell assembly and the positive terminal, or between the negative electrode of the battery cell assembly and the negative terminal, wherein the switch element is controllable to be turned on or off. The control unit is electrically connected to the switch element and the processing unit and adapted to control the switch element to be turned on or off after receiving the leakage signal.

The advantage of the present invention is that the leakage detection device of the present invention could be adapted to detect leakage, and the battery pack including the leakage detection device could block electric power when the leakage is detected, thereby avoiding electrical disaster caused by the leakage.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
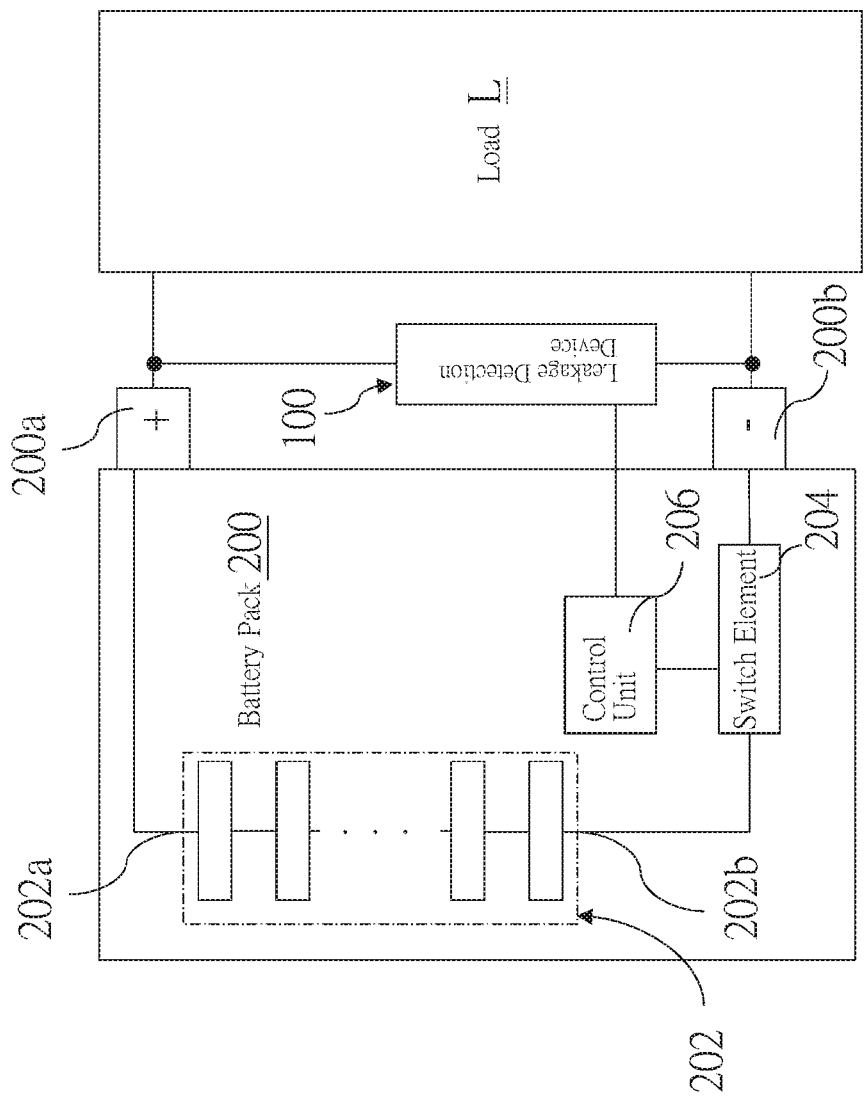
FIG. 1 is a schematic diagram showing a leakage detection device of a first embodiment of the present invention is applied to a battery pack.
Figure 2:
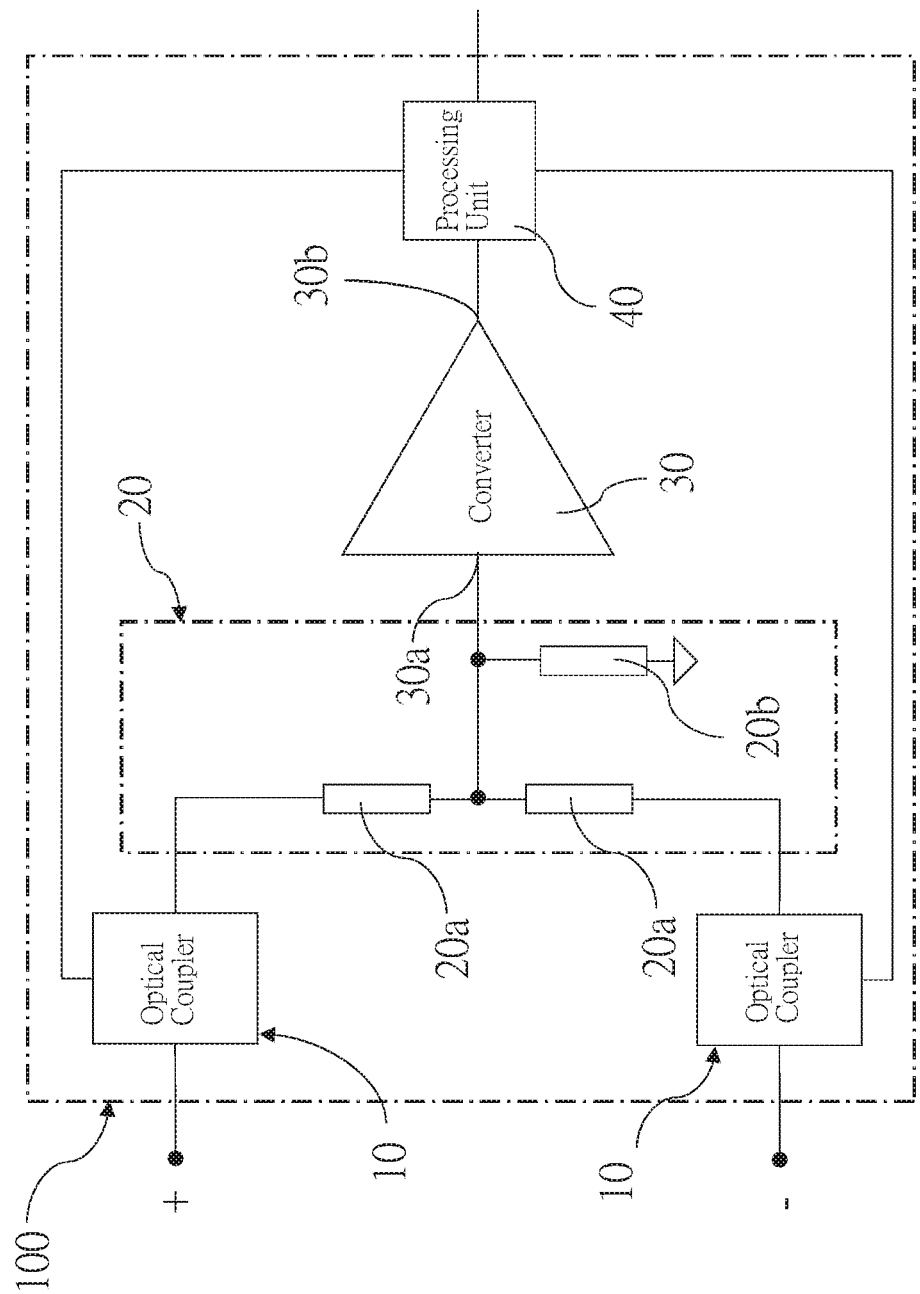
FIG. 2 is a circuit diagram of the leakage detection device according to the first embodiment.

The following illustrative embodiments and drawings are provided to illustrate the disclosure of the present invention, these and other advantages and effects can be clearly understood by persons skilled in the art after reading the disclosure of this specification. Referring to FIG. 1 and FIG. 2, which are schematic views showing a leakage detection device 100 of a first embodiment according to the present invention, wherein the leakage detection device 100 is electrically connected to a DC power supply which is a battery pack 200 as an example; the battery pack 200 includes a battery cell assembly 202, a switch element 204, and a control unit 206.

The battery cell assembly 202 includes a positive electrode 202a and a negative electrode 202b, wherein the positive electrode 202a is electrically connected to the positive terminal 200a, and the negative electrode 202b is electrically connected to the negative terminal 200b via the switch element 204; both of the positive terminal 200a and the negative terminal 200b are electrically connected to a load L. The switch element 204 is controllable to be turned on or off. Although in the current embodiment, the switch element 204 is connected between the negative electrode 202b and the negative terminal 200b. However, in other embodiments, the switch element 204 could be electrically connected between the positive electrode 202a and the positive terminal 200a, or between the negative electrode 202b and the negative terminal 200b. The control unit 206 is electrically connected to the switch element 204 to control the switch element 204 to be turned on or off.

The leak detection device 100 is disposed outside of the battery pack 200 and includes at least one optical coupler 10, at least one voltage divider 20, an analog-to-digital converter 30, and a processing unit 40.

In the current embodiment, the leak detection device 100 includes two optical couplers 10, wherein one of the optical couplers 10 has one end being electrically connected to the positive terminal 200a of the battery pack 200, and another one has one end being electrically connected to the negative terminal 200b the battery pack 200. The two optical couplers 10 respectively detect a leakage degree of each electric wire disposed between the positive terminal 200a and the load L and the negative terminal 200b and the load L to output an electrical signal according to the leakage degree. The optical couplers 10 are controllable to be turned on or off.

The at least one voltage divider 20 includes two input resistors 20a and one voltage dividing resistor 20b, wherein the two input resistors 20a have ends which are electrically connected to one of the optical couplers 10 respectively, and another ends which are electrically connected to the analog-to-digital converter 30 respectively together with one end of the voltage dividing resistor 20b; another end of the voltage dividing resistor 20b is electrically connected to a ground terminal The analog-to-digital converter 30 includes an input terminal 30a and an output terminal 30b, wherein the input terminal 30a is electrically connected to the voltage dividing resistor 20b and the output terminal 30b is electrically connected to the processing unit 40.

The processing unit 40 is electrically connected to the two optical couplers 10 and the control unit 206, respectively, and is adapted to individually control the two optical couplers 10 to be turned on or off. When the processing unit 40 controls one of the two optical couplers 10 to be turned on, the processing unit 40 would control another one to be turned off.

With the design of the leakage detection device 100 mentioned above, the processing unit 40 would control only one of the two optical couplers 10 to be turned on to detect the leakage degree instead of detecting the leakage degrees between both of the positive terminal 200a and the negative terminal 200b and the load L at the same time so as to ensure the accuracy of leakage detection result.

When the input resistor 20a receives the electrical signal output from the optical coupler 10, the electrical signal would be divided by the voltage dividing resistor 20b and then be output to the analog-to-digital converter 30. The divided electrical signal would be converted by the analog-to-digital converter 30 into a digital signal and the digital signal is output to the processing unit 40. The processing unit 40 would compare a digital value corresponding to the digital signal with a reference value. When a difference between the digital value and the reference value is greater than a predetermined difference, a leakage signal is output to the control unit 206. Then, the control unit 206 would control the switch element 204 to turn off the electrical connection between the battery cell assembly 202 and the load L when the control unit receives the leakage signal.

From the above, it could be known that the leakage detection device 100 of the current embodiment could detect the leakage of the electric wires between the DC power supply and the load L. More specifically, by utilizing the control unit 206 and the switch element 204, the electric power could be blocked when the leakage is detected, thereby avoiding the danger of electric shock to personnel.

Figure 3:
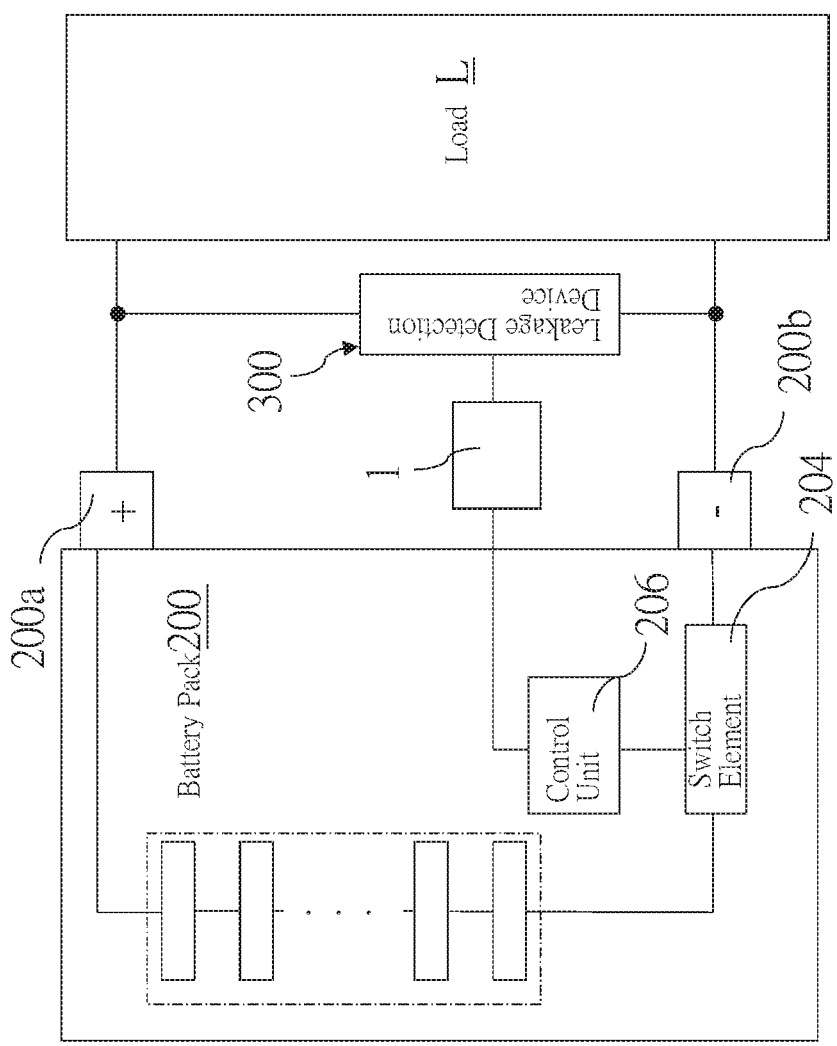
FIG. 3 is a schematic diagram showing a leakage detection device of a second embodiment of the present invention is applied to a battery pack.

Referring to FIG. 3, a leakage detection device 300 of a second embodiment according to the present invention is different from that of the first embodiment in that an output of the leakage detection device 300 is electrically connected to an external control device 1 rather than being directly and electrically connected to the control unit 206 which is disposed in the battery pack 200. When the leakage detection device 300 outputs a leakage signal, the leakage signal would be transmitted to the external control device 1, and the external control device 1 would transmit a control signal to control unit 206 after receiving the leakage signal so as to further control the switch element 204 to be turned off through the control unit 206. Whereby, the electrical connection between the battery pack 200 and the load L could be switched off.

In other embodiments, the external control device 1 also could directly control the switch element 204 of the battery pack 200 to switch off the electrical connection. In addition, the switch element 204 could also be disposed outside the battery pack 200 and be electrically connected between any one of the positive terminal 200a and the negative terminal 200b of the battery pack 200 and the load L.

Figure 4:
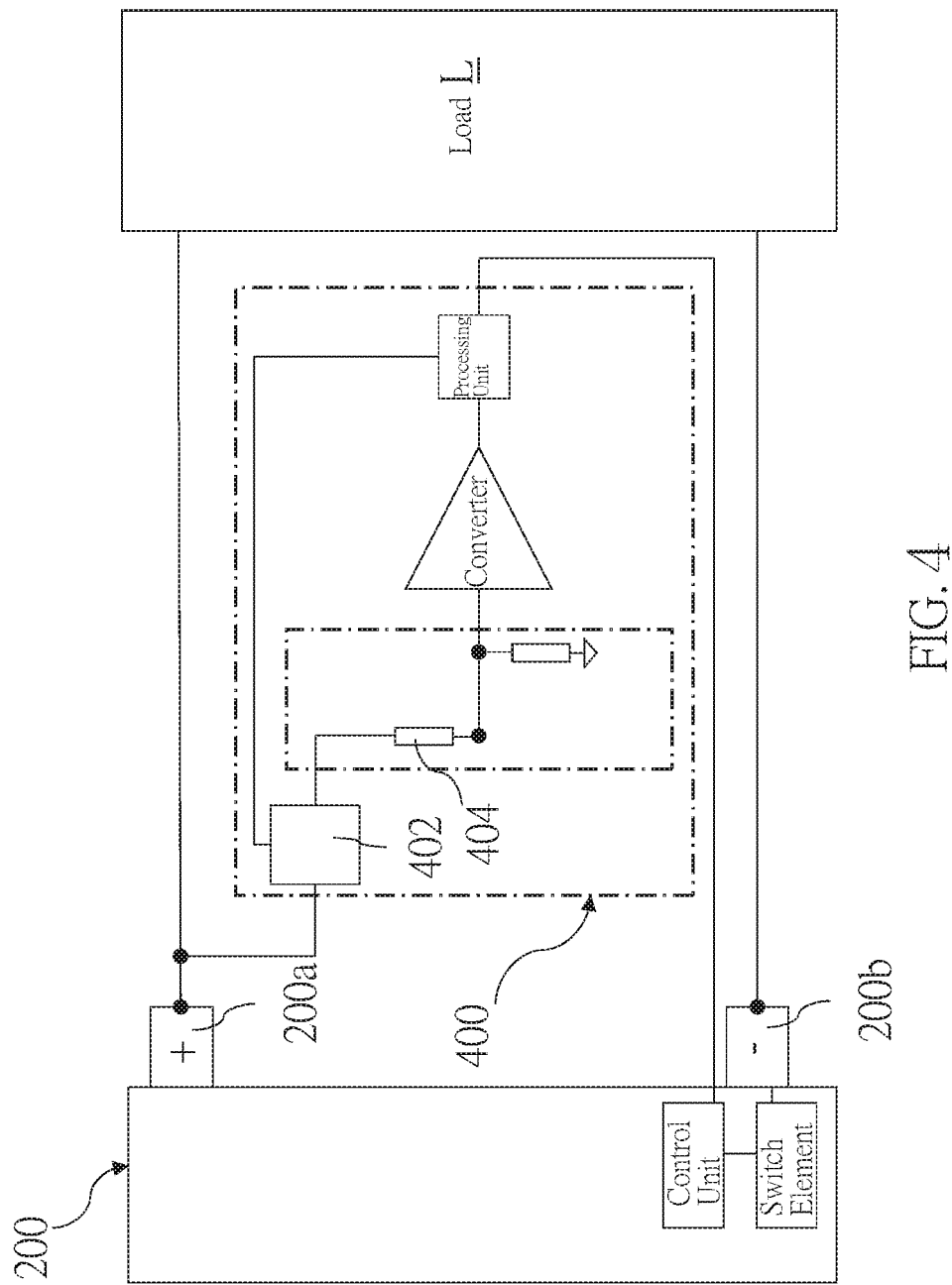
FIG. 4 is a schematic diagram showing a leakage detection device of a third embodiment of the present invention is applied to a battery pack.

Referring to FIG. 4, a leakage detection device 400 of a third embodiment according to the present invention is different from that of the first embodiment in that the leakage detection device 400 only includes one optical coupler 402 and one input resistor 404, wherein the optical coupler 402 has one end being electrically connected to the input resistor 404. In the current embodiment, another end of the optical coupler 402 is electrically connected to the positive terminal 200a of the battery pack 200, and is adapted to detect a leakage degree of the electric wire between the positive terminal 200a and the load L. In other embodiments, the optical coupler 402 could also be electrically connected to the negative terminal 200b of the battery pack 200, and be adapted to detect a leakage degree of the electric wire between the negative terminal 200b and the load L.

Figure 5:
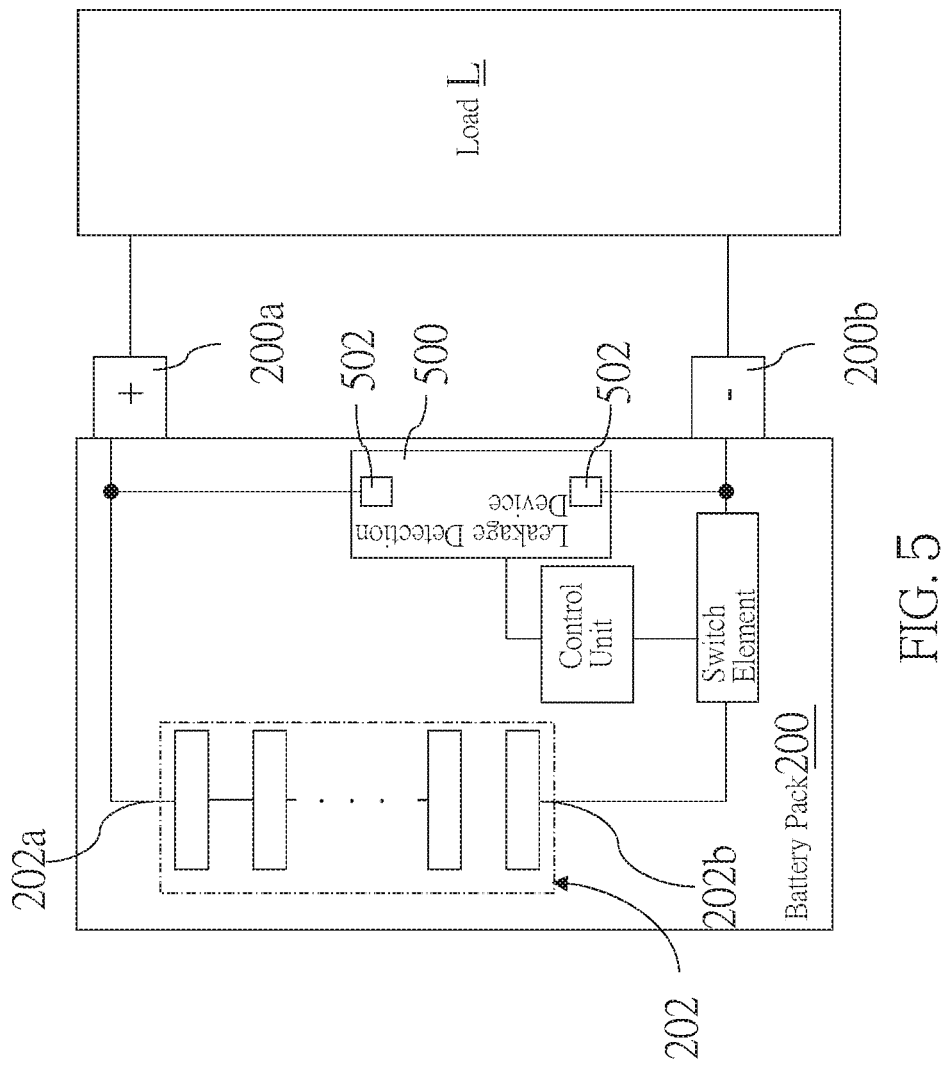
FIG. 5 is a schematic diagram showing a leakage detection device of a fourth embodiment of the present invention is applied to a battery pack.

Referring to FIG. 5, a leakage detection device 500 of a fourth embodiment according to the present invention is different from that of the first embodiment in that the leakage detection device 500 includes optical couplers 502, one of which has one end being electrically connected between the positive terminal 200a and the positive electrode 202a of the battery cell assembly 200, and another one has one end being electrically connected between the negative terminal 200b and the negative electrode 202b. In other words, the leakage detecting device 500 is disposed within the battery pack 200 so as to form the battery pack 200 including the leakage detecting device 500. In one embodiment, the leakage detection device 500 could also be electrically connected to only one of the positive electrode 202a and the negative electrode 202b. The leak detection device 500 could also be disposed on a housing of the battery pack 200.

In sum, the leakage detection device of the present invention could be adapted to detect leakage, and the battery pack including the leakage detection device could block electric power when the leakage is detected, thereby avoiding electrical disaster caused by the leakage.

It must be pointed out that the embodiments described above are only some embodiments of the present invention. All equivalent structures which employ the concepts disclosed in this specification and the appended claims should fall within the scope of the present invention.

What is claimed is:

1. A leakage detection device adapted to be electrically connected to a DC power supply, comprising:
    at least one optical coupler being electrically connected to at least one of a positive terminal and a negative terminal of the DC power supply, wherein the at least one optical coupler is adapted to output an electrical signal according to a leakage degree of an electric wire connected between the positive terminal or the negative terminal and a load;
    a voltage divider being electrically connected to the at least one optical coupler, wherein the voltage divider is adapted to divide the electrical signal after receiving the electrical signal and then output a divided electrical signal;
    an analog-to-digital converter being electrically connected to the voltage divider, wherein the analog-to-digital converter is adapted to convert the divided electrical signal into a digital signal and output the digital signal; and
    a processing unit being electrically connected to the analog-to-digital converter, wherein the processing unit is adapted to receive the digital signal and compare a digital value corresponding to the digital signal with a reference value, and output a leak signal when a difference between the digital value and the reference value is greater than a predetermined difference.

2. The leakage detection device according to claim 1, wherein the voltage divider includes at least one input resistor and a voltage dividing resistor; one end of the at least one input resistor is electrically connected to the at least one optical coupler, while another end of the at least one input resistor is electrically connected to the voltage dividing resistor and the analog-to-digital converter.

3. The leakage detection device according to claim 2, wherein the leakage detection device includes two optical couplers and two input resistors; the two optical couplers are respectively, electrically connected to the positive terminal and the negative terminal; two ends of the two input resistors are respectively electrically connected to the two optical couplers, and another ends of the two input resistors are electrically connected to the voltage dividing resistor and the analog-to-digital converter.

4. The leakage detection device according to claim 1, wherein the processing unit is electrically connected to the at least one optical coupler to control the at least one optical coupler to be turned on or off; the at least one optical coupler outputs an electrical signal according to a leakage degree of an electric wire between the positive terminal or the negative terminal and the load when the at least one optical coupler is turned on.

5. The leakage detection device according to claim 4, wherein the leakage detection device includes two optical couplers which are respectively, electrically connected to the positive terminal and the negative terminal; when one of the optical couplers is controlled by the processing unit to be turned on, another one of the optical couplers would be controlled by the processing unit to be turned off.

6. A battery pack, comprising:
    a battery cell assembly including a positive electrode and a negative electrode, wherein the positive electrode is electrically connected to a positive terminal, and the negative electrode is electrically connected to a negative terminal; the positive terminal and the negative terminal are adapted to be electrically connected to a load;
    at least one optical coupler being electrically connected at least one of the positive terminal and the negative terminal, and adapted to detect a leakage degree of an electric wire between the positive terminal or the negative terminal and the load and output an electrical signal corresponding to the leakage degree;
    a voltage divider being electrically connected to the at least one optical coupler, and adapted to receive and divide the electrical signal and output a divided electrical signal;
    an analog-to-digital converter being electrically connected to the voltage divider, and adapted to convert the divided electrical signal into a digital signal and output the digital signal;
    a processing unit being electrically connected to the analog-to-digital converter, and adapted to receive the digital signal and compare a digital value corresponding to the digital signal with a reference value, and then output a leak signal when a difference between the digital value and the reference value is greater than a predetermined difference;
    a switch element being electrically connected between the positive electrode of the battery cell assembly and the positive terminal, or between the negative electrode of the battery cell assembly and the negative terminal, wherein the switch element is controllable to be turned on or off; and
    a control unit being electrically connected to the switch element and the processing unit, and adapted to control the switch element to be turned off after receiving the leakage signal.

7. The battery pack according to claim 6, wherein the voltage divider includes at least one input resistor and a voltage dividing resistor, wherein one end of the at least one input resistor is electrically connected to the at least one optical coupler, while another end of the at least one input resistor is electrically connected to the voltage dividing resistor and the analog-to-digital converter.

8. The battery pack according to claim 7, wherein the battery pack includes two optical couplers and two input resistors; the two optical couplers are respectively, electrically connected to the positive terminal and the negative terminal; two ends of the two input resistors are respectively electrically connected to the two optical couplers, and another ends of the two input resistors are electrically connected to the voltage dividing resistor and the analog-to-digital converter.

9. The battery pack according to claim 6, wherein the processing unit is electrically connected to the at least one optical coupler to control the at least one optical coupler to start or stop detecting a leakage degree of an electric wire between the positive terminal or the negative terminal and the load.

10. The battery pack according to claim 9, wherein the battery pack includes two optical couplers which are respectively electrically connected to the positive terminal and the negative terminal; when one of the two optical couplers is controlled by the processing unit to be turned on, another one of the two optical couplers is controlled by the processing unit to be turned off.

\* \* \* \* \*